United States Patent
Quinn et al.

(10) Patent No.: US 10,951,204 B2
(45) Date of Patent: Mar. 16, 2021

(54) DIGITAL PULSE WIDTH MODULATION DRIVER SYSTEM

(71) Applicant: Maxim Integrated Products, Inc., San Jose, CA (US)

(72) Inventors: Simon Kenneth Quinn, Edinburgh (GB); Ross William Ballany, Edinburgh (GB); Rajdeep Mukhopadhyay, Edinburgh (GB); Sergei Slavnov, Kirkcaldy (GB)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 16/553,743

(22) Filed: Aug. 28, 2019

(65) Prior Publication Data

US 2020/0076414 A1 Mar. 5, 2020

Related U.S. Application Data

(60) Provisional application No. 62/725,229, filed on Aug. 30, 2018.

(51) Int. Cl.
*H03K 7/08* (2006.01)
*H03K 5/06* (2006.01)
*H03K 7/02* (2006.01)
*H02M 3/156* (2006.01)

(52) U.S. Cl.
CPC ............ *H03K 7/08* (2013.01); *H02M 3/156* (2013.01); *H03K 5/06* (2013.01); *H03K 7/02* (2013.01)

(58) Field of Classification Search
CPC ............ H03F 2200/03; H03F 3/217; H03F 2200/351; H03K 7/08; H03K 7/02; H03K 5/06; H02M 3/156
See application file for complete search history.

(56) References Cited

U.S. PATENT DOCUMENTS

| | | | |
|---|---|---|---|
| 6,175,272 B1* | 1/2001 | Takita | H03F 1/0244 330/10 |
| 2006/0103458 A1* | 5/2006 | Hansen | H03F 3/68 330/10 |
| 2009/0289709 A1* | 11/2009 | Khoury | H03F 3/217 330/251 |
| 2013/0223651 A1* | 8/2013 | Hoyerby | H03F 3/2173 381/120 |
| 2018/0254757 A1* | 9/2018 | Zhang | H03F 3/183 |

* cited by examiner

*Primary Examiner* — David S Huang
(74) *Attorney, Agent, or Firm* — Robert Crownover

(57) ABSTRACT

A digital pulse width modulation driver system and method can include: receiving input digital data with a digital signal processing chip on a device; converting the input digital data into pulse width modulated data; generating an amplitude signal with the digital signal processing chip; transmitting the amplitude signal and the pulse width modulated data from a transmit interface within the device to a receive interface within an analog driver chip; and amplifying the pulse width modulated data with a driver coupled to a high voltage rail based on the amplitude signal corresponding to the high voltage rail, or amplifying the pulse width modulated data with the driver coupled to a low voltage rail based on the amplitude signal corresponding to the low voltage rail.

23 Claims, 5 Drawing Sheets

DIGITAL PULSE WIDTH MODULATION DRIVER SYSTEM

CROSS-REFERENCE TO RELATED APPLICATION(S)

This claims priority benefit to all common subject matter of U.S. Provisional Patent Application No. 62/725,229 filed Aug. 30, 2018. The content of this application, in its entirety, is incorporated herein by reference.

TECHNICAL FIELD

This disclosure relates to digital pulse width modulation drivers, more particularly to low power digital pulse width modulation class-D headphone driver architecture.

BACKGROUND

The rapid rise of wireless portable electronics devices, like cellular phones, laptop computers, and wearable devices has given rise to an insatiable demand for lower power consumption in electronic systems. This demand for lower power is acutely felt in wireless headphone driver technologies.

Wireless headphone driver technologies have unique attributes resulting in significant impacts on architecture design, in that they must be highly miniaturized, maintain excellent linearity and noise characteristics, while simultaneously exhibit ultra-low power consumption. As an extension of the semiconductor industry, the headphone driver industry has witnessed ever-increasing commercial competitive pressures, along with growing consumer expectations and diminishing opportunities for meaningful product differentiation in the marketplace.

Average power consumption is at the very core of next generation headphone driver insertion strategies outlined in road maps for development of next generation wireless headphones. Competitive next generation headphone drivers should increase signal to noise ratio, decrease costs, while providing accurate, linear representation of input signals. Importantly, for some industry segments including wireless headphone drivers, achieving low average power requirements is critical.

Industry road maps have identified significant gaps between the current headphone driver capability and demand for ultra-low power solutions. For example, current state of the art headphone drivers consume a few milliwatts of quiescent power; however, sub-milliwatt quiescent power consumptions will be required for ultra-low power solutions.

The current and commonly used closed-loop class-D amplifier topology requires significantly less power than class-A or class-AB drivers. Current class-D architectures, however, have failed to reach the ultra low power requirements of future portable electronics.

Solutions have been long sought but prior developments have not taught or suggested any complete solutions, and solutions to these problems have long eluded those skilled in the art. Thus, there remains a considerable need for miniaturized headphone driver systems that maintain excellent linearity and noise characteristics while greatly reducing total average power consumption.

BRIEF DESCRIPTION OF THE DRAWINGS

The digital pulse width modulation (DPWM) driver system is illustrated in the figures of the accompanying drawings which are meant to be exemplary and not limiting, in which like reference numerals are intended to refer to like components, and in which.

DETAILED DESCRIPTION

Figure 1:
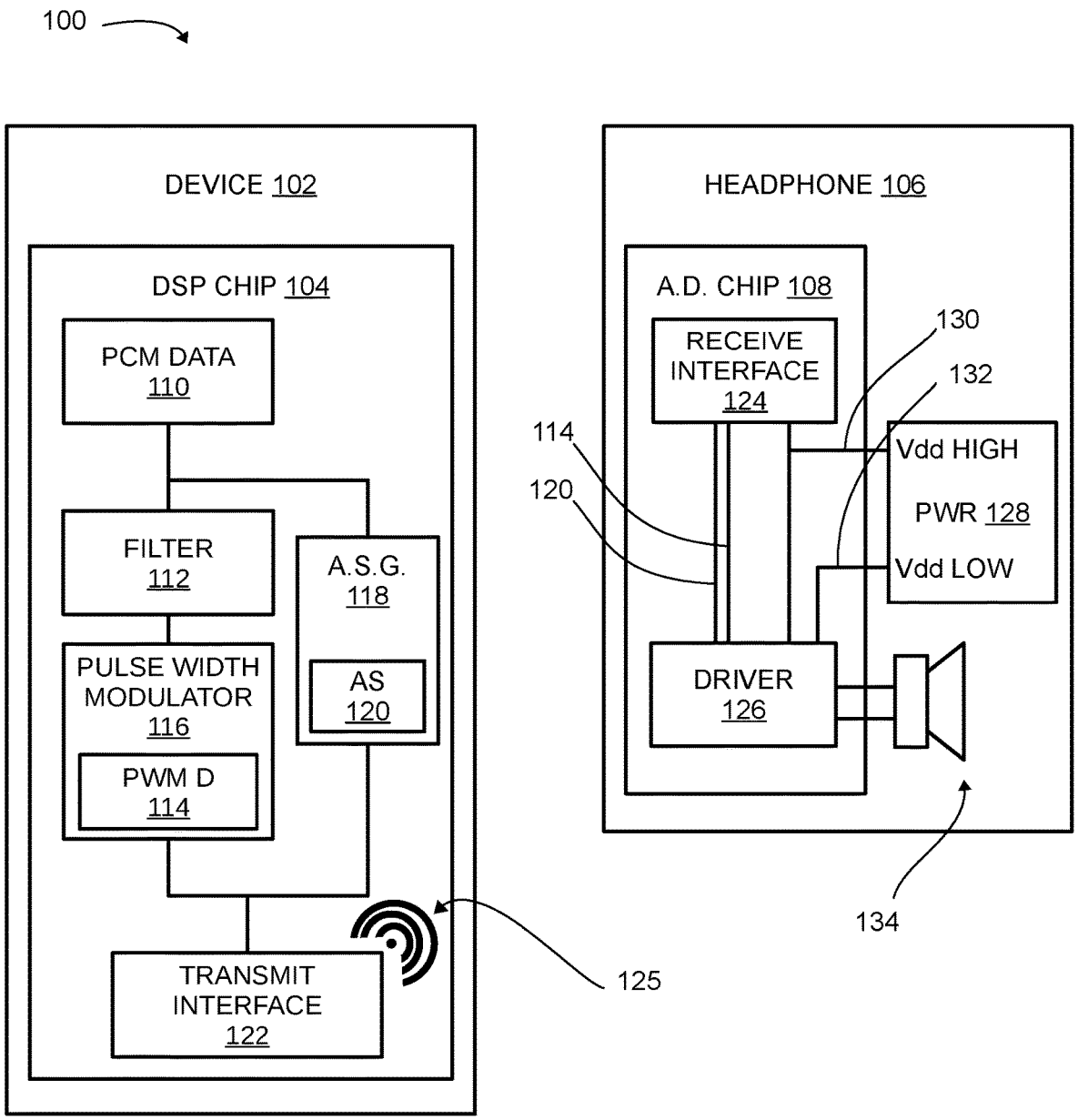
FIG. 1 is a block diagram of the driver system in a first embodiment.

In the following description, reference is made to the accompanying drawings that form a part hereof, and in which are shown by way of illustration, embodiments in which the driver system may be practiced. It is to be understood that other embodiments may be utilized and structural changes may be made without departing from the scope of the driver system.

When features, aspects, or embodiments of the driver system are described in terms of steps of a process, an operation, a control flow, or a flow chart, it is to be understood that the steps can be combined, performed in a different order, deleted, or include additional steps without departing from the driver system as described herein.

The driver system is described in sufficient detail to enable those skilled in the art to make and use the driver system and provide numerous specific details to give a thorough understanding of the driver system; however, it will be apparent that the driver system may be practiced without these specific details.

In order to avoid obscuring the driver system, some well-known system configurations and descriptions are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Referring now to FIG. 1, therein is shown a block diagram of the driver system 100 in a first embodiment. The driver system 100 is depicted implemented within a device 102 having a digital signal processing chip 104 and a headphone 106 having an analog driver chip 108.

It is contemplated that the device 102 can store linear or compressed data or can retrieve data in compressed or linear formats. For ease of description, the driver system 100 will be described with regard to audio data, for example.

The device 102 can provide an audio input as digital data, and more particularly as pulse code modulated data 110, to the digital signal processing chip 104. The digital signal processing chip 104 can convert the pulse code modulated data 110 into pulse width modulated data 114.

Non-linearities of the PCM-to-PWM conversion process can be compensated using various feedback techniques combined with adaptive filtering within a filter 112. The pulse width modulated data 114 can be formed within a pulse width modulator 116.

As will be appreciated, since the input signal is the digital pulse code modulated data 110, it is preferable to do a direct digital modulation since the analog generation would require digital to analog conversion resulting in a lower overall power-efficiency. Generally, the digital generation of a pulse width modulated signal (DPWM) can be understood in two parts, the first part including sampling, the second part including a pulse generation, for example.

Here, the input signal to the pulse width modulator 116 is the digital pulse code modulated data 110, meaning the data may arrive uniformly and can represents the magnitude of the original signal with a binary word. For the purposes of this disclosure the conversion from the pulse code modulated data 110 to pulse width modulated data 114 can include a counter-based DPWM, a delay line-based DPWM, a sigma-delta-modulator based DPWM, or a combination thereof.

The pulse code modulated data 110 can also be input into an amplitude signal generator 118. The amplitude signal generator 118 can generate an amplitude signal 120 based on a threshold of the magnitude of the pulse code modulated data 110. For example, if the magnitude of the pulse code modulated data 110 is above the threshold, the amplitude signal generator 118 can return a high amplitude signal 120. Alternatively, if the magnitude of the pulse code modulated data 110 is below the threshold the amplitude signal generator 118 can return a low amplitude signal 120.

It is contemplated that the threshold for generating the amplitude signal 120 can be used to determine efficiency characteristics of the headphone 106 by determining when the headphone will run in a lower power mode and when it will be running at full power. Further, it is contemplated in other implementations based on modulated audio streams of formats other than the pulse code modulated data 110, such as pulse density modulated input data, that the amplitude signal 120 could be generated based on the magnitude of the digital signal input into the digital signal processing chip 104.

The amplitude signal 120 along with the pulse width modulated data 114 can be input into a transmit interface 122. The transmit interface 122 can establish an audio data link with a receive interface 124. The audio data link is contemplated to be a wired data link, a wireless data link 125, or a combination thereof.

It is contemplated that the transmit interface 122 can be a synchronous pulse width modulated interface capable of transmitting high sample rate audio data of around three megahertz. Illustratively, this can include technologies such as Soundwire™, and other high sample rate audio data transmission schemes. The transmit interface 122 can establish an audio data link with a receive interface 124.

The amplitude signal 120, along with the pulse width modulated data 114 can be contained within the data link of the transmit interface 122 or can be sent by a separate wire. It has been discovered that generating the pulse width modulated data 114 using the digital signal processing chip 104 on the device 102 saves large amounts of power within the headphone 106. This is due to the DPWM conversion process being performed on the device 102 rather than on the analog driver chip 108 of the headphone 106.

The transmit interface 122 can embed the amplitude signal 120 with the pulse width modulated data 114 within a wireless datalink between the transmit interface 122 and the receive interface 124. When the transmit interface 122 is configured to embed the amplitude signal 120 within the data link, the analog driver chip 108 can decode the amplitude signal 120 and provide both the pulse width modulated data 114 received by the receive interface 124 along with the amplitude signal 120 to a driver 126. The receive interface 124 along with the driver 126 can be powered by a power supply 128.

The power supply 128 can provide multiple voltage rails. For ease of description the power supply 128 voltage rails will be described with regard to a high voltage rail 130 and a low voltage rail 132, which can be regarded as a first voltage rail and a second voltage rail, respectively; however, it is to be understood that the power supply 128 can be configured to provide more than two rails at various voltages. Illustratively, for example, the receive interface 124 and the driver 126 can be powered with the high voltage rail 130.

For clarity of description the voltages of the high voltage rail 130 and the low voltage rail 132 should be understood with respect or in relation to each other. For the purposes of enablement, some contemplated embodiments can supply three to five volts at the high voltage rail 130 and can supply roughly one hundred millivolts at the low voltage rail 132.

It is contemplated that the amplitude signal 120 could be a single bit in the case of a two-voltage rail power supply 128 or could include additional bits as needed to identify additional voltage rails. Illustratively, the amplitude signal 120 could be a single bit as a 1 or a 0 to identify and correspond with either the high voltage rail 130 or the low voltage rail 132.

The power supply 128 can be a single battery with a power control module including DC-DC converters to generate the voltages for the various voltage rails. It is contemplated that in some implementations the voltage rails could be combined into a single programmable or variable voltage rail. In other embodiments it is contemplated that the power supply 128 could include multiple batteries for supplying different voltages to different voltage rails.

It has been discovered that utilizing the low voltage rail 132 can improve noise performance by minimizing clock jitter. The low voltage rail 132 can be an additional input into the driver 126. A speaker 134 can be a load coupled to the driver 126.

Figure 2:
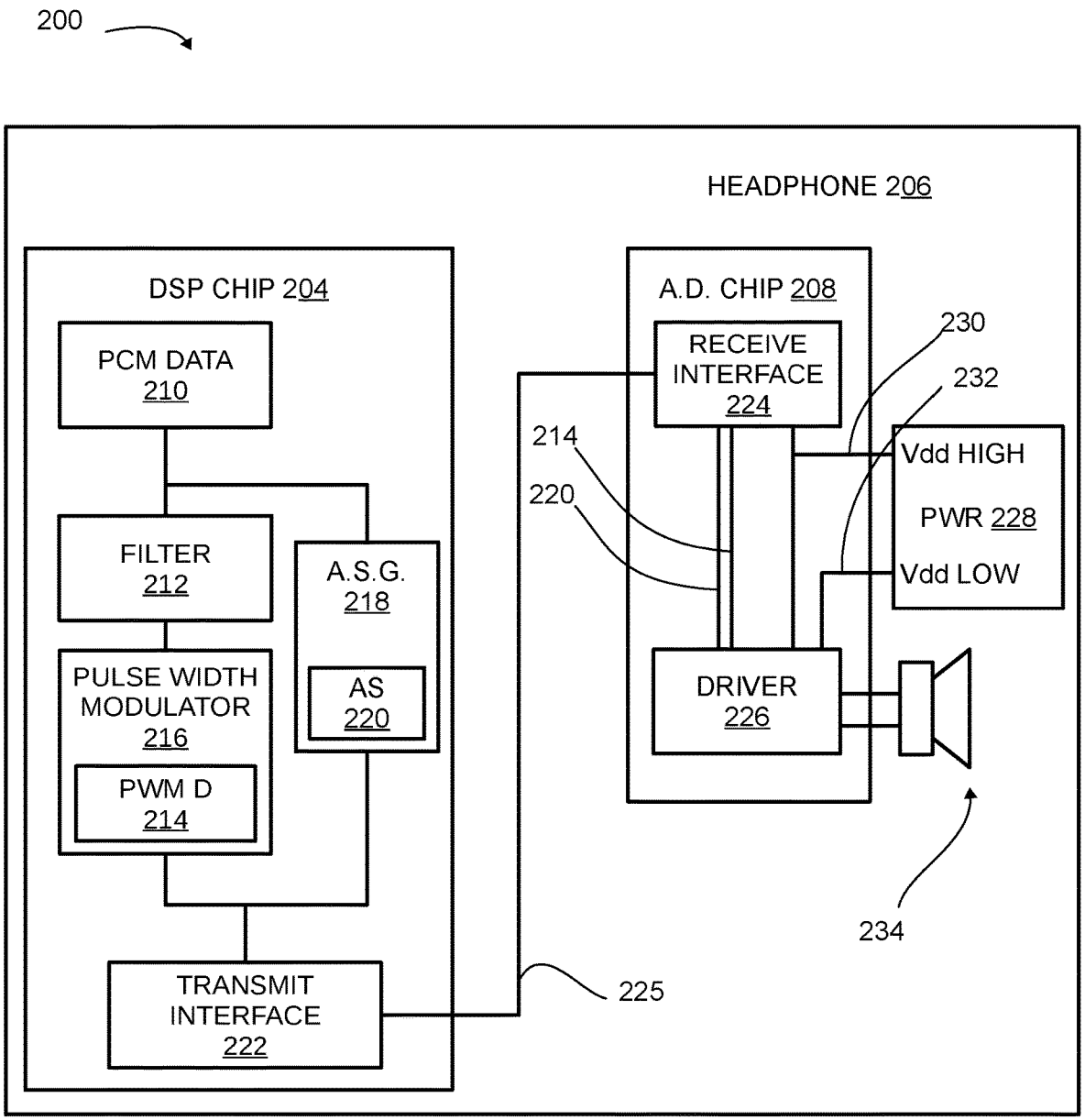
FIG. 2 is a block diagram of the driver system in a second embodiment.

Referring now to FIG. 2, therein is shown a block diagram of the driver system 200 in a second embodiment. The driver system 200 is intended to operate in much the same manner as the driver system 100 of FIG. 1 except where the differences are explained.

Illustratively, for example the wireless transmission of the driver system 200, between a device and a headphone can come from a Bluetooth™ transceiver which would be part of a digital signal processing chip 204 contained within the headphone 206. It is contemplated that the headphone 206 of the second embodiment could be used in conjunction with the device 102 of FIG. 1.

The headphone 206 is shown not only with the digital signal processing chip 204 but also including an analog driver chip 208.

The headphone 206 can receive an audio input as digital data, and more particularly as pulse code modulated data 210 from the transmit interface 122 of FIG. 1, for example, to the digital signal processing chip 204. The digital signal processing chip 204 can convert the pulse code modulated data 210 into pulse width modulated data 214.

Non-linearities of the PCM-to-PWM conversion process can be compensated using various feedback techniques combined with adaptive filtering within a filter 212. The pulse width modulated data 214 can be formed within a pulse width modulator 216.

As will be appreciated, since the input signal is the digital pulse code modulated data 210, it is preferable to do a direct digital modulation since the analog generation would require digital to analog conversion resulting in a lower overall power-efficiency. Generally, the digital generation of a pulse width modulated signal (DPWM) can be understood in two parts, the first part including sampling, the second part including a pulse generation, for example.

Here, the input signal to the pulse width modulator 216 is the digital pulse code modulated data 210, meaning the data may arrive uniformly and can represents the magnitude of the original signal with a binary word. For the purposes of this disclosure the conversion from the pulse code modulated data 210 to pulse width modulated data 214 can include a counter-based DPWM, a delay line-based DPWM, a sigma-delta-modulator based DPWM, or a combination thereof.

The pulse code modulated data 210 can also be input into an amplitude signal generator 218. The amplitude signal generator 218 can generate an amplitude signal 220 based on a threshold of the magnitude of the pulse code modulated data 210. For example, if the magnitude of the pulse code modulated data 210 is above the threshold, the amplitude signal generator 218 can return a high amplitude signal 220. Alternatively, if the magnitude of the pulse code modulated data 210 is below the threshold, the amplitude signal generator 218 can return a low amplitude signal 220.

It is contemplated that the threshold for generating the amplitude signal 220 can be used to determine efficiency characteristics of the headphone 206 by determining when the headphone will run in a lower power mode and when it will be running at full power. Further, it is contemplated in other implementations based on modulated audio streams of formats other than the pulse code modulated data 210, such as pulse density modulated input data, that the amplitude signal 220 could be generated based on the magnitude of the digital signal input into the digital signal processing chip 204.

The amplitude signal 220 along with the pulse width modulated data 214 can be input into a transmit interface 222. The transmit interface 222 can establish an audio data link with a receive interface 224.

The audio data link is contemplated to be a wired data link 225, a wireless data link, or a combination thereof. It is contemplated that the transmit interface 222 can be a synchronous pulse width modulated interface capable of transmitting high sample rate audio data of around three megahertz. Illustratively, this can include technologies such as Soundwire™, and other high sample rate audio data transmission schemes.

The amplitude signal 220, along with the pulse width modulated data 214 can be contained within the data link of the transmit interface 222 or can be sent by a separate wire. The transmit interface 222 can embed the amplitude signal 220 with the pulse width modulated data 214 within a wired datalink between the transmit interface 222 and the receive interface 224.

When the transmit interface 222 is configured to embed the amplitude signal 220 within the data link, the analog driver chip 208 can decode the amplitude signal 220 and provide both the pulse width modulated data 214 received by the receive interface 224 along with the amplitude signal 220 to a driver 226. The receive interface 224 along with the driver 226 can be powered by a power supply 228.

The power supply 228 can provide multiple voltage rails. For ease of description the power supply 228 voltage rails will be described with regard to a high voltage rail 230 and a low voltage rail 232, which can be regarded as a first voltage rail and a second voltage rail, respectively; however, it is to be understood that the power supply 228 can be configured to provide more than two rails at various voltages. Illustratively, for example, the receive interface 224 and the driver 226 can be powered with the high voltage rail 230.

For clarity of description the voltages of the high voltage rail 230 and the low voltage rail 232 should be understood with respect or in relation to each other. For the purposes of enablement, some contemplated embodiments can supply three to five volts at the high voltage rail 230 and can supply roughly one hundred millivolts at the low voltage rail 232.

It is contemplated that the amplitude signal 220 could be a single bit in the case of a two-voltage rail power supply 228 or could include additional bits as needed to identify additional voltage rails. Illustratively, the amplitude signal 220 could be a single bit as a 1 or a 0 to identify and correspond with either the high voltage rail 230 or the low voltage rail 232.

The power supply 228 can be a single battery with a power control module including DC-DC converters to generate the voltages for the various voltage rails. It is contemplated that in some implementations the voltage rails could be combined into a single programmable or variable voltage rail. In other embodiments it is contemplated that the power supply 228 could include multiple batteries for supplying different voltages to different voltage rails.

It has been discovered that utilizing the low voltage rail 232 can improve noise performance by minimizing clock jitter. The low voltage rail 232 can be an additional input into the driver 226. A speaker 234 can be a load coupled to the driver 226.

Figure 3:
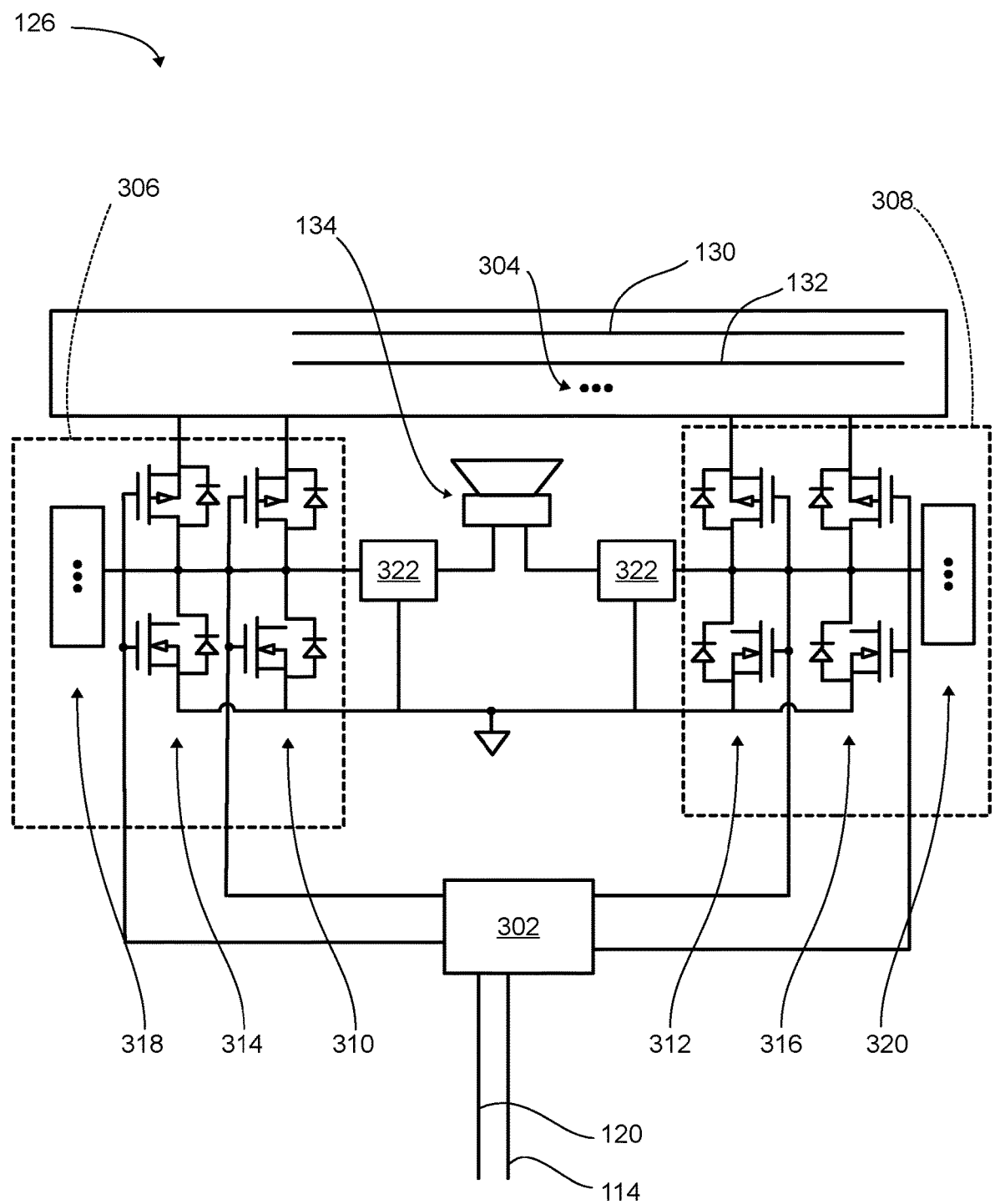
FIG. 3 is the driver of FIG. 1.

Referring now to FIG. 3, therein is shown the driver 126 of FIG. 1. The driver is described herein for clarity as an open loop H-bridge, which is shown coupled both to the high voltage rail 130 and the low voltage rail 132. However, the driver is not intended to be so limited unless specifically claimed.

As is described and disclosed in greater detail below, the pulse width modulated data 114 can be amplified with the open loop H-bridge driver 126 coupled to the high voltage rail 130 based on the amplitude signal 120 corresponding to the high voltage rail 130. Alternatively, the pulse width modulated data 114 can be amplified with the open loop H-bridge driver 126 coupled to the low voltage rail 132 based on the amplitude signal 120 corresponding to the low voltage rail 132. The output of the driver 126 can drive the speaker 134.

The driver 126 is shown having the amplitude signal 120 and the pulse width modulated data 114 input into an H-bridge controller 302. The receive interface 124 of FIG. 1 can provide both the amplitude signal 120 and the pulse width modulated data 114 as inputs to the H-bridge controller 302.

Additionally, the high voltage rail 130 and the low voltage rail 132 can provide voltage levels to the driver 126. It is contemplated that any number of additional voltage rails 304 could be included as inputs from the power supply 128 of FIG. 1.

Figure 4:
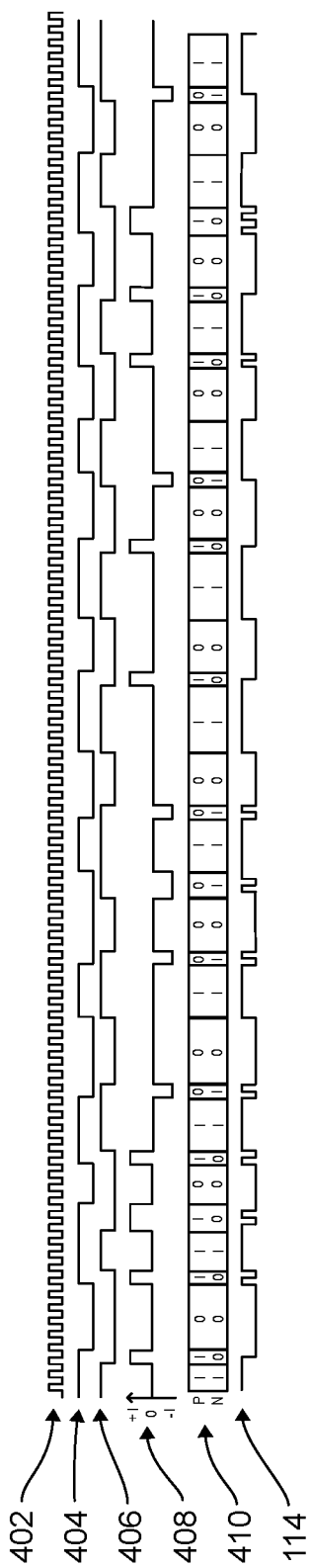
FIG. 4 is a timing diagram of a transmit protocol for differential pulse width modulated data for the transmit interface of FIG. 1.
Figure 5:
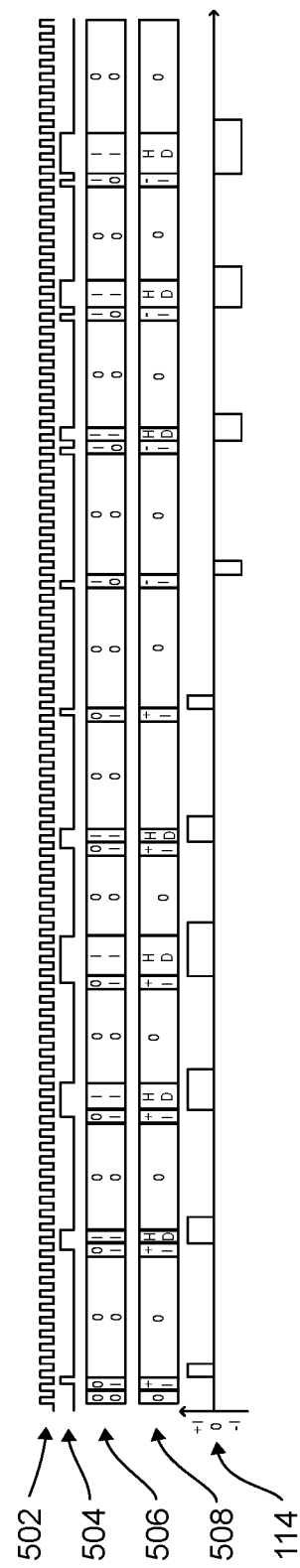
FIG. 5 is a timing diagram of a transmit protocol for tri-level pulse width modulated data for the transmit interface of FIG. 1.

As will be appreciated, the pulse width modulated data 114 can include a P-component and an N-component as is shown with regard to FIGS. 4 and 5. The driver 126 can include P-component devices 306 which can correspond to the P-component of the pulse width modulated data 114 in some embodiments. The driver 126 can further include N-component devices 308 which can correspond to the N-component of the pulse width modulated data 114 in some embodiments.

For each voltage rail provided by the power supply 128, the driver 126 can include a plurality of transistors for both the P-component devices 306 and the N-component devices 308. That is, for example, the P-component devices 306 can include a high voltage P-component transistor pair 310 coupled to the high voltage rail 130 and the N-component devices 308 can include a high voltage N-component transistor pair 312 coupled to the high voltage rail 130; however, it is contemplated that some embodiments could employ single transistors rather than transistor pairs.

Further, the P-component devices 306 can include a low voltage P-component transistor pair 314 coupled to the low voltage rail 132 and the N-component devices 308 can include a low voltage N-component transistor pair 316 coupled to the low voltage rail 132. Additional P-component transistor pairs 318 and additional N-component transistor pairs 320 can be included and can correspond to the additional voltage rails 304.

In one configuration, the H-bridge controller 302 can include a switch. The switch can select the transistor pairs corresponding to the voltage rail corresponding to the amplitude signal 120.

That is, for example, when the amplitude signal 120 is 1, the H-bridge controller 302 could select the high voltage P-component transistor pair 310 and the high voltage N-component transistor pair 312 coupled to the high voltage rail 130, which can be indicated by the amplitude signal 120 value of 1. Alternatively, when the amplitude signal 120 is 0, the H-bridge controller 302 could select the low voltage P-component transistor pair 314 and the low voltage N-component transistor pair 316 coupled to the low voltage rail 132, which can be indicated by the amplitude signal 120 value of 0.

Additionally, it is contemplated that when the amplitude signal 120 identifies additional voltage rails 304, the H-bridge controller 302 can select the additional P-component transistor pairs 318 and the additional N-component transistor pairs 320. As will be appreciated, the transistor pairs of the N-component devices 308 and the P-component devices 306 selected based on the amplitude signal 120 can operationally form a full-bridge output stage. The full bridge can utilize one of the transistor pairs from the N-component devices 308 and one of the transistor pairs from the P-component devices 306 to drive the speaker 134.

When the pulse width modulated data 114 is a differential pulse width modulated signal, the full-bridge configuration operates by alternating the conduction path through the speaker 134. This allows bidirectional current to flow through the load without the need of a negative supply or a DC-blocking capacitor.

The H-bridge controller 302 can generate gate drives for the P-component devices 306 and the N-component devices 308. It is contemplated that when the pulse width modulated data 114 is fully differential pulse width modulated data as shown in FIG. 4, the H-bridge controller 302 can include additionally an inverter.

Illustratively, the differential pulse width modulated data can be sent from the H-bridge controller 302 to the P-component devices 306 selected by the H-bridge controller 302. The differential pulse width modulated data can simultaneously be inverted and sent from the H-bridge controller 302 to the N-component devices 308 selected by the H-bridge controller 302.

It is contemplated that when encoding schemes other than the differential pulse width modulated data is used, such as the tri-level pulse width modulated data of FIG. 5, other components can be used within the H-bridge controller 302 to generate the gate drives for the N-component devices 308 and the P-component devices 306.

In some contemplated embodiments of the driver system 100, protection circuitry can be included to isolate low voltage devices. For example, the protection circuitry could be implemented to isolate the N-component devices 308 and P-component devices 306 coupled to the low voltage rail 132. The driver 126 can further include low pass filters 322 on the outputs of the N-component devices 308 and the P-component devices 306, prior to the speaker 134.

Referring now to FIG. 4, therein is shown a timing diagram of a transmit protocol for differential pulse width modulated data 114 for the transmit interface 122 of FIG. 1. The transmission protocol can illustrate differential pulse width modulated data 114, which can be one of many pulse width modulation schemes used and supported by the driver system 100 of FIG. 1. The differential pulse width modulated data 114 can be converted from the pulse code modulated data 110 of FIG. 1.

The timing diagram can provide the transmission protocol for the differential pulse width modulated data 114 over a single wire, which can be the output of the transmit interface 122. Illustratively, the timing diagram can include a clock 402, a P-component 404, an N-component 406, a P-N wave 408, a P-N 2-bit data representation 410, and the pulse width modulated data 114 output.

As will be appreciated, the difference between the P-component 404 and the N-component 406 can be calculated at the rising edge of each clock pulse. The difference between the P-component 404 and the N-component 406 can be represented as the P-N wave 408 and the P-N 2-bit data representation 410.

The pulse width modulated data 114 can be the output of the transmit interface 122 and can embody the P-component 404 with every other clock cycle and the N-component 406 in-between. The pulse width modulated data 114 can be transmitted along with the amplitude signal 120 of FIG. 1 to the receive interface 124 of FIG. 1.

Referring now to FIG. 5, therein is shown a timing diagram of a transmit protocol for tri-level pulse width modulated data 114 for the transmit interface 122 of FIG. 1. The transmission protocol can illustrate tri-level pulse width modulated data 114, which can be one of many pulse width modulation schemes used and supported by the driver system 100 of FIG. 1. The tri-level pulse width modulated data 114 can be converted from the pulse code modulated data 110 of FIG. 1.

The timing diagram can provide the transmission protocol for the tri-level pulse width modulated data 114 over a single wire, which can be the output of the transmit interface 122. Illustratively, the timing diagram can include a clock 502, a data stream 504, a 2-bit data representation 506, a symbol data representation 508, and the pulse width modulated data 114 output.

As will be appreciated, the 2-bit data representation 506 can include sets of two data bits that correspond to the symbol data representation 508. Illustratively, the bits 00, 01, 10, and 11 can correspond to the symbols zero, +1, −1, and hold, respectively. For clarity, the symbol hold is represented in FIG. 5 by "HD" within the symbol data representation 508.

The pulse width modulated data 114 can be generated based on the symbols contained in the data stream 504 in that a value of zero will be generated for every zero symbol, a +1 will be generated for the +1 symbol and will be held at +1 for as long as the symbol hold immediately follows the +1 symbol. Similarly, a −1 will be generated for the −1 symbol and will be held at −1 for as long as the symbol hold immediately follows the −1 symbol. The pulse width modulated data 114 can be transmitted along with the amplitude signal 120 of FIG. 1 to the receive interface 124 of FIG. 1.

Figure 6:
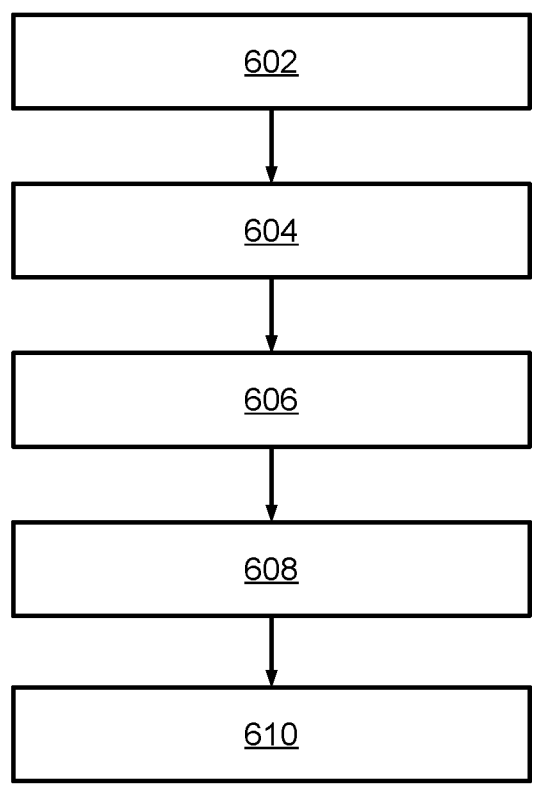
FIG. 6 is a flow chart for a method of operating the driver system.

Referring now to FIG. 6, therein is shown a flow chart for operating the driver system 100 of FIG. 1. The method of operating the driver system 100 can include: receiving input digital data, such as digital audio data, with a digital signal processing chip on a device in a block 602; converting the input digital data into pulse width modulated data with a pulse width modulator on the digital signal processing chip in a block 604; generating an amplitude signal with an amplitude signal generator on the digital signal processing chip in a block 606; transmitting the amplitude signal and the pulse width modulated data from a transmit interface within the device to a receive interface within a headphone in a block 608; and amplifying the pulse width modulated data with a driver, such as an open loop H-bridge, coupled to a high voltage rail based on the amplitude signal corresponding to the high voltage rail, or amplifying the pulse width modulated data with the driver coupled to a low voltage rail based on the amplitude signal corresponding to the low voltage rail in a block 610.

Thus, it has been discovered that the driver system furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

While the driver system has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

What is claimed is:

1. A method of operating a digital pulse width modulation driver system comprising:
   receiving input digital data with a digital signal processing chip on a device;
   converting the input digital data into pulse width modulated data with the digital signal processing chip;
   generating an amplitude signal with the digital signal processing chip;
   transmitting the amplitude signal and the pulse width modulated data from a transmit interface within the device to a receive interface within an analog driver chip; and
   amplifying the pulse width modulated data with a driver coupled to a high voltage rail based on the amplitude signal corresponding to the high voltage rail, or amplifying the pulse width modulated data with the driver coupled to a low voltage rail based on the amplitude signal corresponding to the low voltage rail.

2. The method of claim 1 wherein generating the amplitude signal includes generating the amplitude signal based on a magnitude of the input digital data falling above or below a threshold, the amplitude signal corresponding to the high voltage rail based on the magnitude of the input digital data falling above the threshold, and the amplitude signal corresponding to the low voltage rail based on the magnitude of the input digital data falling below the threshold.

3. The method of claim 1 wherein transmitting the amplitude signal includes embedding the amplitude signal with the pulse width modulated data within a wireless datalink between the transmit interface and the receive interface.

4. The method of claim 1 wherein transmitting the amplitude signal includes transmitting the amplitude signal on a separate wire from the transmit interface to the receive interface.

5. The method of claim 1 wherein transmitting the pulse width modulated data includes transmitting the pulse width modulated data synchronously between the transmit interface and the receive interface.

6. A method of operating a digital pulse width modulation driver system comprising:
   receiving pulse code modulated data with a digital signal processing chip on a device;
   filtering the pulse code modulated data with a filter within the digital signal processing chip;
   converting the pulse code modulated data into pulse width modulated data with the digital signal processing chip;
   generating an amplitude signal with the digital signal processing chip;
   transmitting the amplitude signal and the pulse width modulated data from a transmit interface within the device to a receive interface within an analog driver chip; and
   amplifying the pulse width modulated data with a driver coupled to a high voltage rail based on the amplitude signal corresponding to the high voltage rail, or amplifying the pulse width modulated data with the driver coupled to a low voltage rail based on the amplitude signal corresponding to the low voltage rail.

7. The method of claim 6 wherein amplifying the pulse width modulated data includes selecting a plurality of high voltage transistors coupled to the high voltage rail based on the amplitude signal corresponding to the high voltage rail, or selecting a plurality of low voltage transistors coupled to the low voltage rail based on the amplitude signal corresponding to the low voltage rail.

8. The method of claim 6 wherein converting the pulse code modulated data includes converting the pulse code modulated data into a differential pulse width modulated data.

9. The method of claim 6 wherein converting the pulse code modulated data includes converting the pulse code modulated data into a tri-level pulse width modulated data.

10. The method of claim 6 wherein amplifying the pulse width modulated data includes generating gate drive outputs from an H-bridge controller.

11. A digital pulse width modulation driver system comprising:
   a device including a digital signal processing chip, the digital signal processing chip configured to receive an input digital data, convert the input digital data into pulse width modulated data, generate an amplitude signal, and transmit the amplitude signal and the pulse width modulated data from a transmit interface within the device;
   an analog driver chip with a receive interface configured to receive the amplitude signal and the pulse width modulated data from the transmit interface within the device; and
   a driver configured to amplify the pulse width modulated data coupled to a high voltage rail based on the amplitude signal corresponding to the high voltage rail, or configured to amplify the pulse width modulated data with the driver coupled to a low voltage rail based on the amplitude signal corresponding to the low voltage rail.

12. The system of claim 11 wherein the digital signal processing chip is configured to generate the amplitude signal based on a magnitude of the input digital data falling above or below a threshold, the amplitude signal corresponding to the high voltage rail based on the magnitude of the input digital data falling above the threshold, and the amplitude signal corresponding to the low voltage rail based on the magnitude of the input digital data falling below the threshold.

13. The system of claim 11 wherein the transmit interface is configured to embed the amplitude signal with the pulse width modulated data within a wireless datalink between the transmit interface and the receive interface.

14. The system of claim 11 wherein the transmit interface is configured to transmit the amplitude signal on a separate wire from the transmit interface to the receive interface.

15. The system of claim 11 wherein the transmit interface is configured to transmit the pulse width modulated data synchronously between the transmit interface and the receive interface.

16. The system of claim 11 wherein:
the device including the digital signal processing chip is configured to receive pulse code modulated data and convert the input digital data into the pulse width modulated data and the device further comprises a filter configured to filter the pulse code modulated data within the digital signal processing chip.

17. The system of claim 16 wherein the driver includes a plurality of high voltage transistors coupled to the high voltage rail and selected based on the amplitude signal corresponding to the high voltage rail, and the driver includes a plurality of low voltage transistors coupled to the low voltage rail and selected based on the amplitude signal corresponding to the low voltage rail.

18. The system of claim 16 wherein the digital signal processing chip is configured to convert the pulse code modulated data into a differential pulse width modulated data.

19. The system of claim 16 wherein the digital signal processing chip is configured to convert the pulse code modulated data into a tri-level pulse width modulated data.

20. The system of claim 16 further comprising an H-bridge controller configured to generate gate drive outputs for amplifying the pulse width modulated data.

21. A method of operating a digital pulse width modulation driver system comprising:
receiving input digital data with a digital signal processing chip on a device;
converting the input digital data into pulse width modulated data with the digital signal processing chip;
generating an amplitude signal with the digital signal processing chip;
transmitting the amplitude signal and the pulse width modulated data from a transmit interface within the device to a receive interface within an analog driver chip; and
amplifying the pulse width modulated data with a driver coupled to a first voltage rail based on the amplitude signal corresponding to the first voltage rail, or amplifying the pulse width modulated data with the driver coupled to a second voltage rail based on the amplitude signal corresponding to the second voltage rail.

22. The method of claim 21 wherein generating the amplitude signal includes generating the amplitude signal based on a magnitude of the input digital data falling above or below a threshold, the amplitude signal corresponding to the first voltage rail based on the magnitude of the input digital data falling above the threshold, and the amplitude signal corresponding to the second voltage rail based on the magnitude of the input digital data falling below the threshold.

23. The method of claim 21 wherein amplifying the pulse width modulation data with the driver coupled to the first voltage rail includes amplifying the pulse width modulation data.

* * * * *